(12) United States Patent
Kim (10) Patent No.: US 6,333,636 B1
(45) Date of Patent: Dec. 25, 2001

(54) SEMICONDUCTOR WAFER ALIGNING SYSTEM AND METHOD USING SAME

(75) Inventor: Jae-soon Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/167,533

(22) Filed: Oct. 7, 1998

(30) Foreign Application Priority Data

Dec. 8, 1997 (KR) .................................................. 97-66722

(51) Int. Cl.[7] .................................................. G01R 31/02
(52) U.S. Cl. .................................................. 324/758
(58) Field of Search ....................... 324/158.1, 73.1, 324/758, 765; 269/20, 35, 254 R, 21; 33/533, 645, 613; 396/612, 624, 627; 273/108.1; 384/12

(56) References Cited

U.S. PATENT DOCUMENTS

| | | | |
|---|---|---|---|
| 3,675,563 | * | 7/1972 | Metreaud .............................. 396/624 |
| 4,521,995 | * | 6/1985 | Sekiya .................................... 269/21 |
| 4,747,589 | * | 5/1988 | Watson et al. ......................... 269/20 |
| 5,421,401 | * | 6/1995 | Sherstinsky et al. ............ 269/254 R |
| 5,625,433 | * | 4/1997 | Inada et al. .......................... 396/627 |
| 5,689,749 | * | 11/1997 | Tanaka et al. ....................... 396/627 |
| 5,931,465 | * | 8/1999 | Miyake et al. .................... 273/108.1 |

* cited by examiner

Primary Examiner—Vinh P. Nguyen
(74) Attorney, Agent, or Firm—Volentine Francos, PLLC (57) ABSTRACT

A semiconductor wafer aligning system includes a table having a spray opening for upwardly spraying fluid to form a fluid surface on which a semiconductor wafer floats. A guide disposed on the table contacts the wafer at a circumferential edge to guide the wafer to a correct location. Thus, a wafer is aligned without generating particles that hinder semiconductor fabrication, and without directly scratching a front side during back side grinding.

11 Claims, 8 Drawing Sheets

SEMICONDUCTOR WAFER ALIGNING SYSTEM AND METHOD USING SAME

FIELD OF THE INVENTION

The present invention relates to a semiconductor wafer aligning system and method. More particularly, the present invention relates to a semiconductor wafer aligning system and method wherein a wafer floats on a fluid as the wafer is contacted by guides.

DESCRIPTION OF THE RELATED ART

Generally, in the semiconductor device fabrication process, wafers are processed in processing equipment after being moved by a transfer system for loading wafers, and then the wafers are moved to other processing equipment by a transfer system for unloading wafers.

A wafer aligning system is used to secure the wafer at a correct loading location on a stage of the processing equipment so that it may be moved within the processing equipment. If the wafer is not precisely aligned, the wafer may collide with fabrication equipment and may be broken, representing a malfunction of the wafer transfer system.

Generally, the aligning system for wafers can have various configurations and operating principles. Aligning systems can be divided into two different types, a wafer holding aligning system and a wafer guide aligning system. The first type holds the wafer securely by its edges and then moves it into alignment. The second type moves the wafer in contact with guides until alignment is achieved, and then holds the wafer securely by its edges.

The wafer holding aligning system and the wafer guide aligning system are normally operated such that the front surface of the wafer, which has a pattern thereon, faces upwardly and the back surface of the wafer faces downwardly, toward the aligning system.

While the wafer is aligned, any scratch occurring on the back surface of the wafer in contact with the system causes no direct difficulties. However, cleanliness of the cleanroom for semiconductor devices fabrication environment is important, and the ultrafine particles generated due to the scratches can affect the production yield and the reliability of the semiconductor device fabrication process.

In a wafer grinding process, the thickness of the wafer is reduced and the particles accumulated on the back side of the wafer are removed. During this process the back side of the wafer faces upwardly and the front side of the wafer, covered with tape, faces downwardly on the aligning system. Since the tape-covered front side of the wafer contacts the guide, any damage from the guide may penetrate the tape and cause scratches and direct damage to the front side.

In addition, to minimize damage from conventional alignment systems, the aligning operation is typically performed only one time. This makes it difficult to maintain a precise alignment throughout processing.

SUMMARY OF THE INVENTION

The present invention is directed to provide a semiconductor wafer aligning system for aligning a wafer precisely without causing wafer damage or generation of particles.

It is another object of the present invention to use a fluid on which the wafer is made to float to prevent damage and generation of particles.

Another object of the present invention is to provide a semiconductor wafer aligning method using the semiconductor wafer aligning system of the present invention while minimizing the amount of fluid usage.

To achieve these and other advantages and in accordance with the purpose of the present invention as embodied and broadly described, a semiconductor wafer aligning system includes a table having a spray opening for upwardly spraying ultrapure water to form a water surface on which a semiconductor wafer floats. A guide disposed on the table contacts the wafer at a circumferential edge, to guide the wafer into a correct location.

In another aspect of the present invention, an upward extended member is disposed on the table outside a peripheral edge of the spray opening such that the water surface is wider than the spray opening. It includes a wall having an open section such that the wafer floating on the water surface moves horizontally in a drift direction toward the open section.

In another aspect of the present invention, each of a left guide and a right guide of the guide includes a horizontal plate for supporting the bottom of the wafer when the wafer is not floating, and an upward protruded part connected to the horizontal plate for contacting the circumferential edge of the wafer. The protruded part is a screw protrusion having a male screw part. The horizontal plate has a plurality of female screws, each corresponding to a respective one of a plurality of wafer diameters.

In another aspect of the invention, a method of aligning a semiconductor wafer using the semiconductor wafer aligning system includes spraying ultrapure water. The spraying includes opening a valve leading to the spray opening so as to spray ultrapure water through the spray opening upward toward a wafer. The wafer is guided, after the spraying, by moving the wafer to a correct position with the guide, and then closing the valve so as to stop the spray of the ultrapure water.

By contacting and aligning a wafer which floats on a water surface of ultrapure water, the present invention substantially obviates one or more of the problems due to the limitations and disadvantages of the related art

DETAILED DESCRIPTION OF THE PREFERRED EMBODIMENTS

Reference will now be made in detail to the preferred embodiments of the present invention, examples of which are illustrated in the accompanying drawings.

Figure 1:
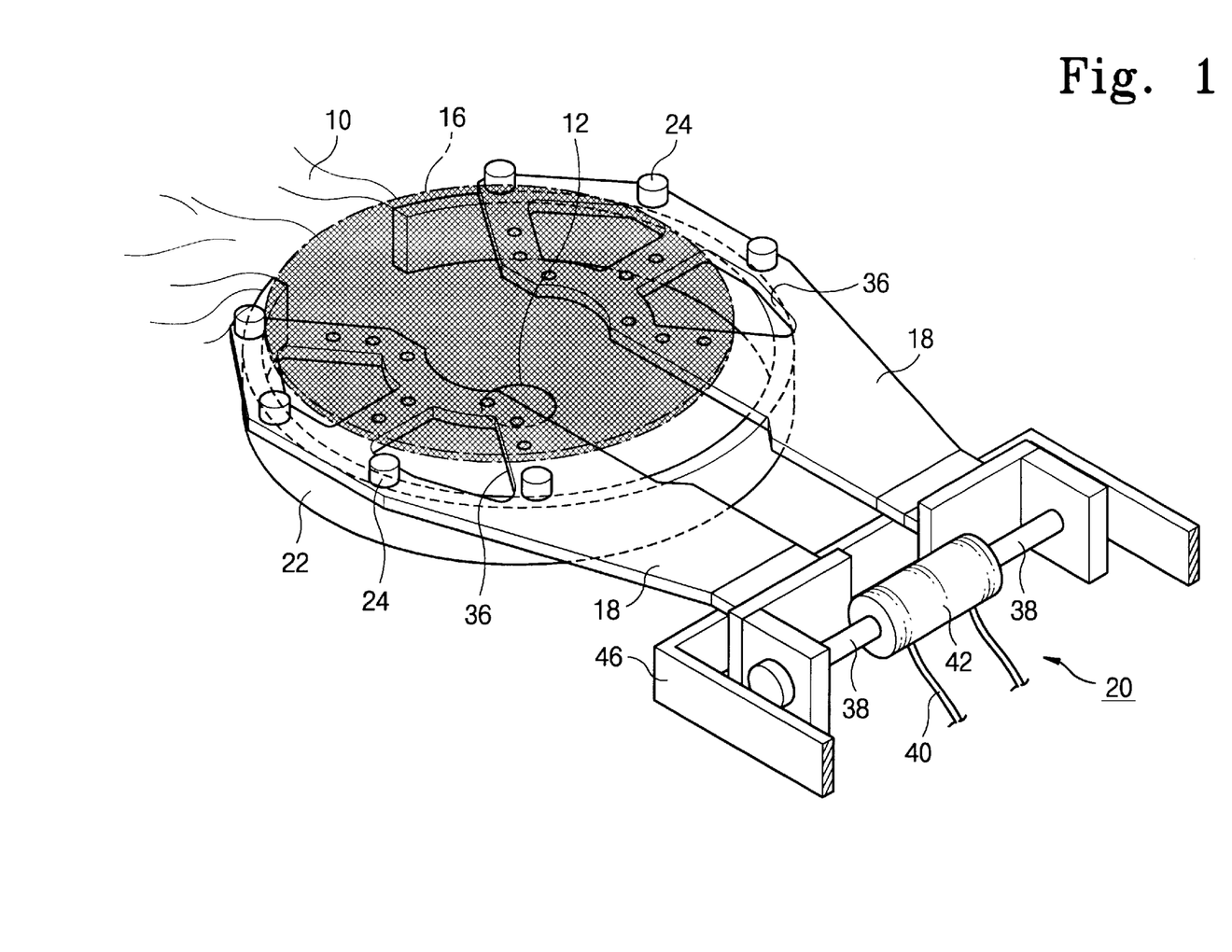
FIG. 1 is a perspective view showing the wafer aligning system according to one embodiment of the present invention, wherein a wafer having a large diameter is mounted on the guide plates of the wafer aligning system.
Figure 2:
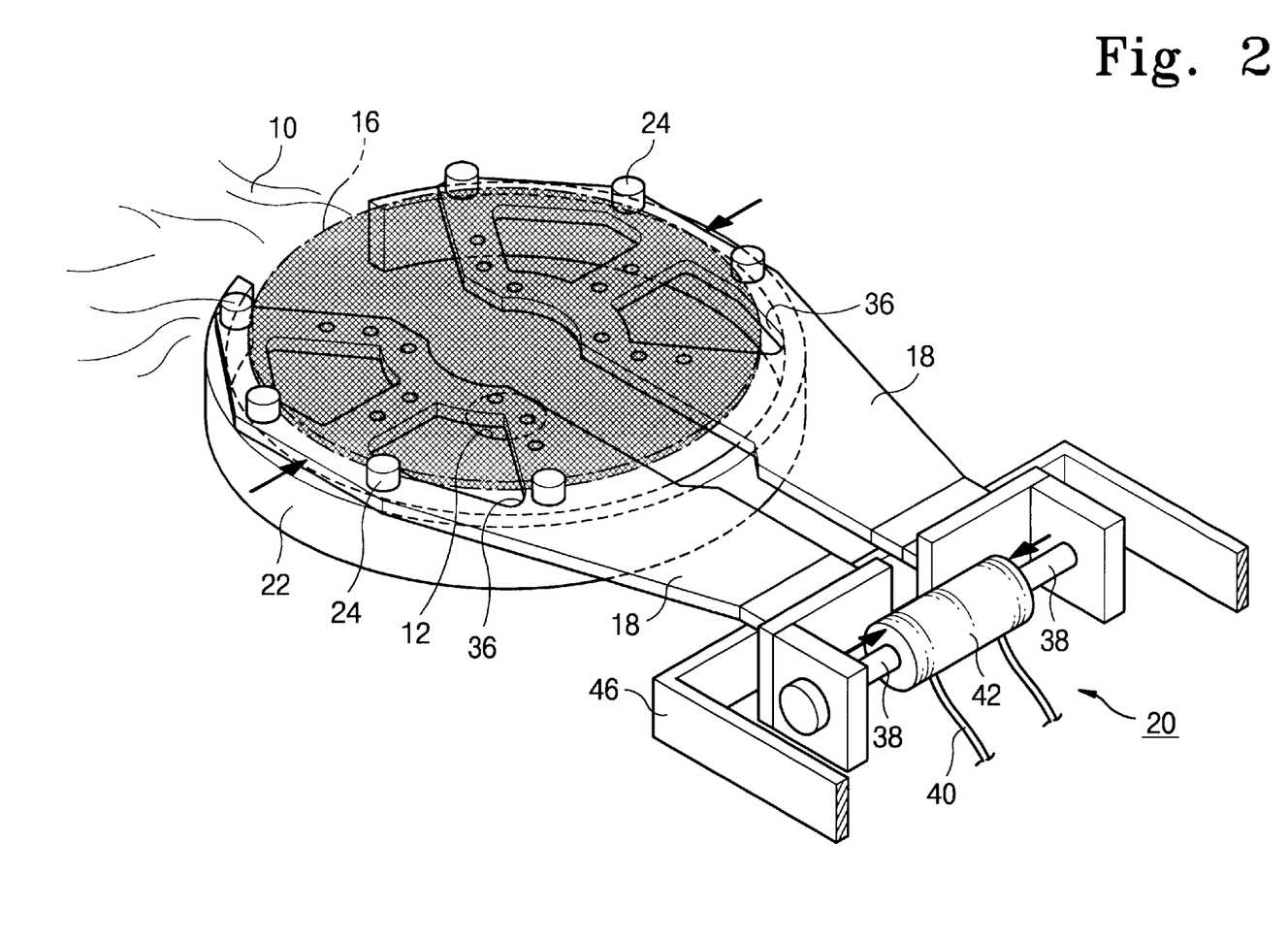
FIG. 2 is a perspective view showing the wafer aligning system according to one embodiment of the present invention, wherein the wafer having a large diameter is contacted and aligned by the protruding parts on the guide plates of the wafer aligning system.
Figure 3:
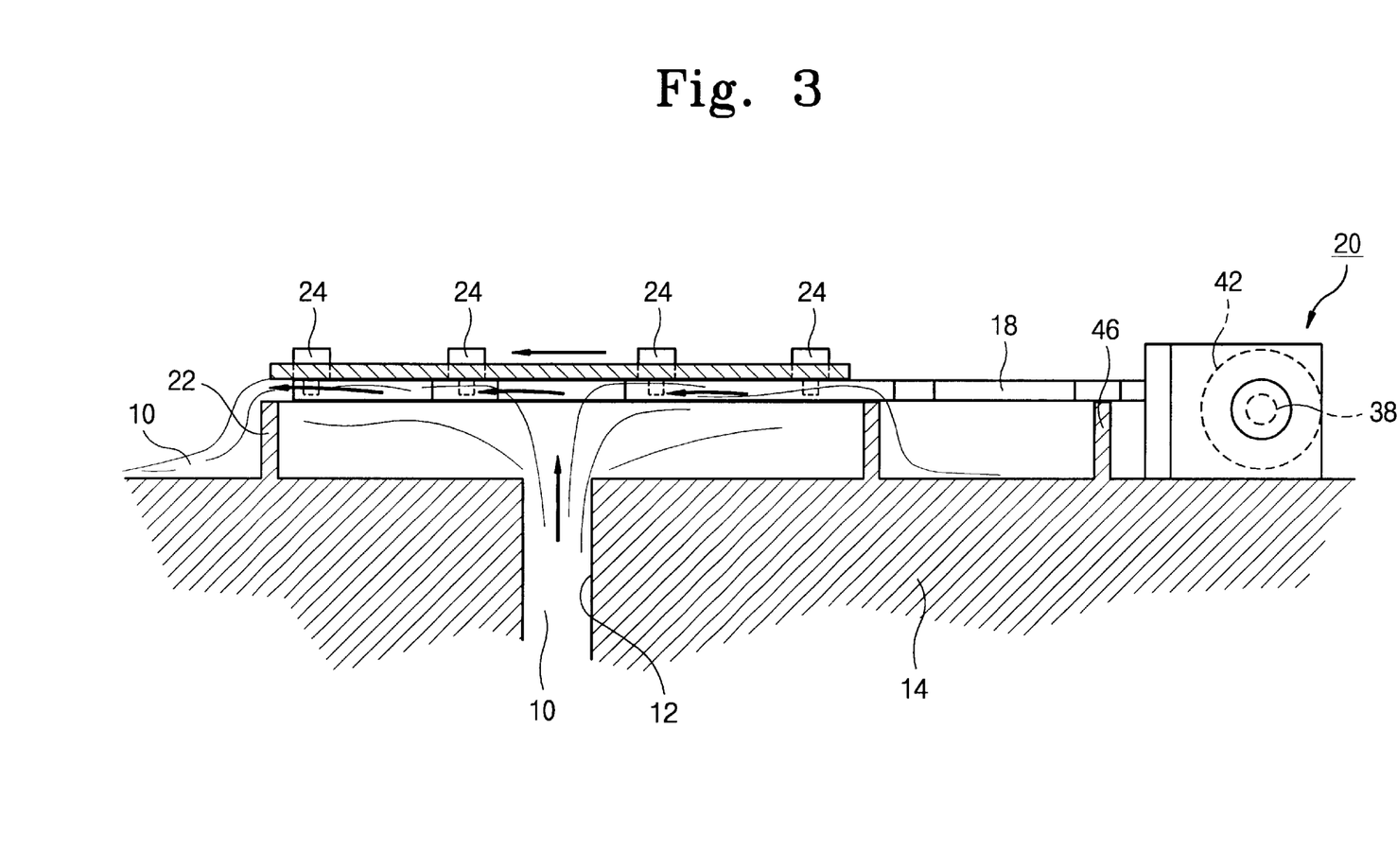
FIG. 3 is a partial sectional view showing the wafer aligning system of FIG. 2.

FIG. 1 is a perspective view showing the wafer aligning system according to one embodiment of the present invention, wherein a wafer having a large diameter is mounted so as to contact guide plates of the wafer aligning system. FIG. 2 is a perspective view showing the wafer aligning system according to one embodiment of the present invention, wherein the wafer having a large diameter is contacted at its edge and aligned, i.e., moved to a correct position by the guide plates of the wafer aligning system. FIG. 3 is a partial sectional view showing the wafer aligning system of FIG. 2.

Referring to FIGS. 1–3, the wafer aligning system includes a table 14 having a spray opening 12 for spraying a fluid 10 supplied from a fluid source (not shown) at a spray pressure. In the embodiments described herein, the fluid 10 is ultrapure water. Other suitable fluids may be employed as well. A wafer 16 floats on a water surface formed by the spray pressure. Guides, such as left and right guide plates 18, are mounted on the table 14 and contact the wafer on different portions of the wafer circumference so as to guide the wafer and move it to a correct horizontal location.

In the example embodiment of FIGS. 1–3, a drive part 20 is connected to the left or right guide plates, or both, for controlling the distance between the two guide plates 18 between wide and narrow limits.

The table 14 may include a vertically extended member 22, such as a pool wall, which protrudes from the table at a location outside the peripheral edge sides of the spray opening 12. The pool wall holds a certain amount of the ultrapure water 10 sprayed from the spray opening 12 such that the water surface is extended horizontally as wide as the pool wall. A part A of the wall of the extended member 22 is open so that the wafer 16 floating on the water surface drifts along the water surface of the ultrapure water 10 in a drift direction, as indicated by the horizontal arrows in FIG. 3.

FIG. 3. The ultrapure water 10 is sprayed through the spray opening 12 at a spray volume such that the water fills the area enclosed by the pool wall 22 and continuously overflows the pool wall at part A as shown in FIG. 3. Due to the spray volume of the water and the surface tension on the surface of the water, the surface of the water enclosed within the pool wall is slightly higher than the top of the pool wall.

Alignment. This easy alignment is possible because the guide plates 18 are not in contact with the wafer during the alignment. The bottom of the wafer floats above the top of the guide plates due to the surface tension of the water, and the edges of the wafer do not contact the protrusions 24 on the guide plates, because the guides plates are spaced apart such that the protrusions are separated by a distance larger than the diameter of the wafer. Operation of the guide plates to align the wafer in a second alignment is discussed in detail below.

Therefore, the wafer 16 floats on the water surface formed by the upward water pressure sprayed through the spray opening 12 located on the table 14. The extended member 22 formed around the spray opening 12 sets the width of the water surface to be large enough that the wafer 16 floats sufficiently to allow for easy alignment.

The water surface also functions to absorb the particles contained in the surrounding air and on the downwardly facing side of the wafer, and to discharge these particles through a discharge opening. Such absorption minimizes the undesirable effects of particles on the wafer 16.

In addition, as shown in FIG. 1, enough of the sprayed ultrapure water flows in the direction of the open wall A of the extended member 22 as described above, that the wafer 16 drifts in the direction of the open wall A to complete a first aligning operation in which the wafer is displaced laterally toward the open wall.

After completing the first aligning operation, the laterally displaced wafer 16 is forced centerward as the guide plates 18 close. This continues until the wafer 16 is held securely by the protrusions 24 of the guide plates 18 at substantially directly opposing sides of the wafer edge, as shown in FIG. 2. This completes a second aligning operation. Therefore, the precise aligning operation is substantially achieved by the two operations of the aligning process, i.e., the above first and second aligning operations.

Figure 4:
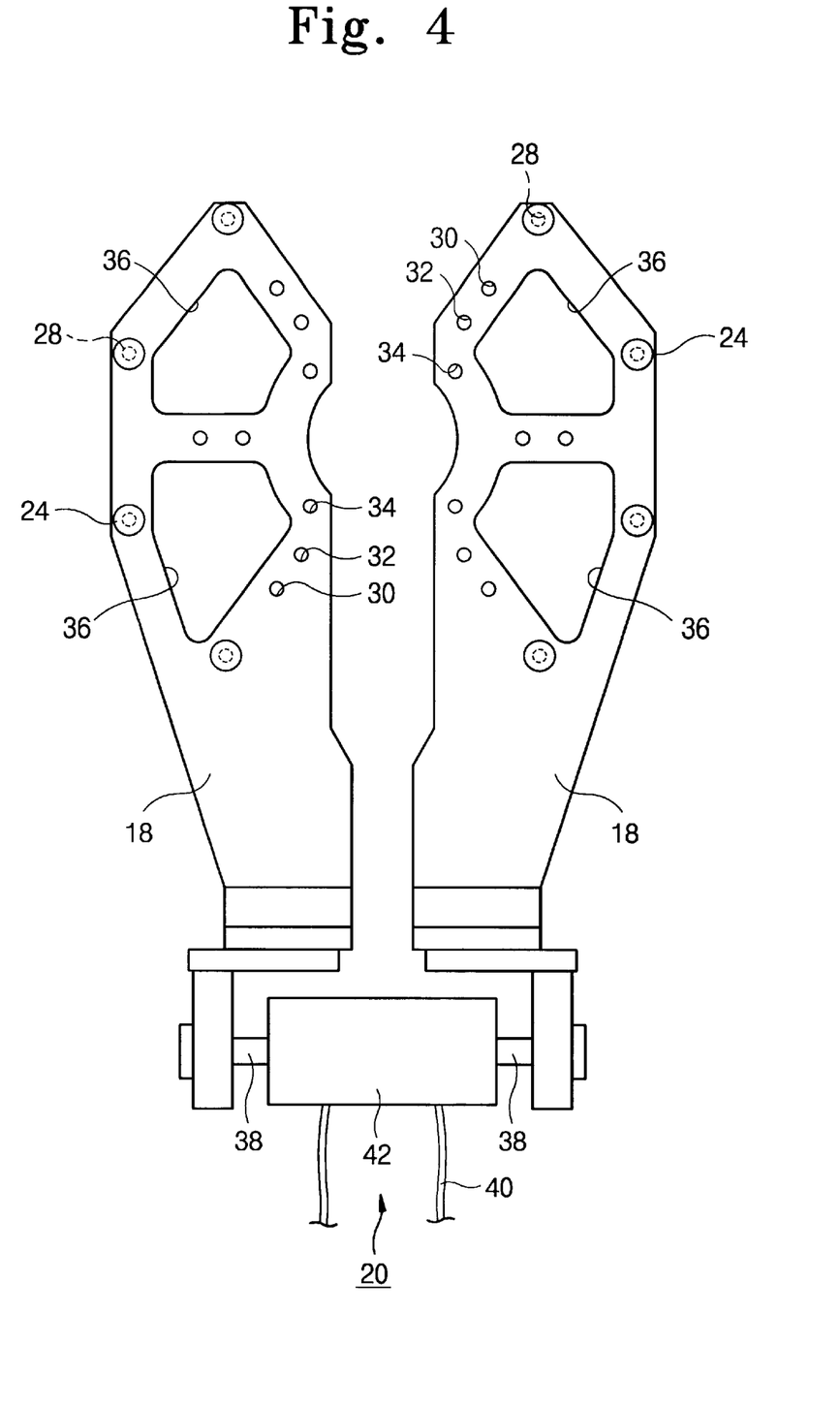
FIG. 4 is a top view showing the guide plates of the wafer aligning system of FIG. 2.

The shape of the guide, such as the guide plates 18 with protrusions 24, can be varied. Preferably, a two-pronged horizontal plate is formed of left and right guide plates 18, as shown in FIG. 4. These horizontal guide plates 18 support the wafer 16 on its lower side when the wafer 16 is mounted thereon. Protruded parts, such as the protrusions 24, are provided on the guide plates 18 for contacting the peripheral edge of the wafer 16 such that the wafer 16 can be both guided and, ultimately, secured.

Figure 6:
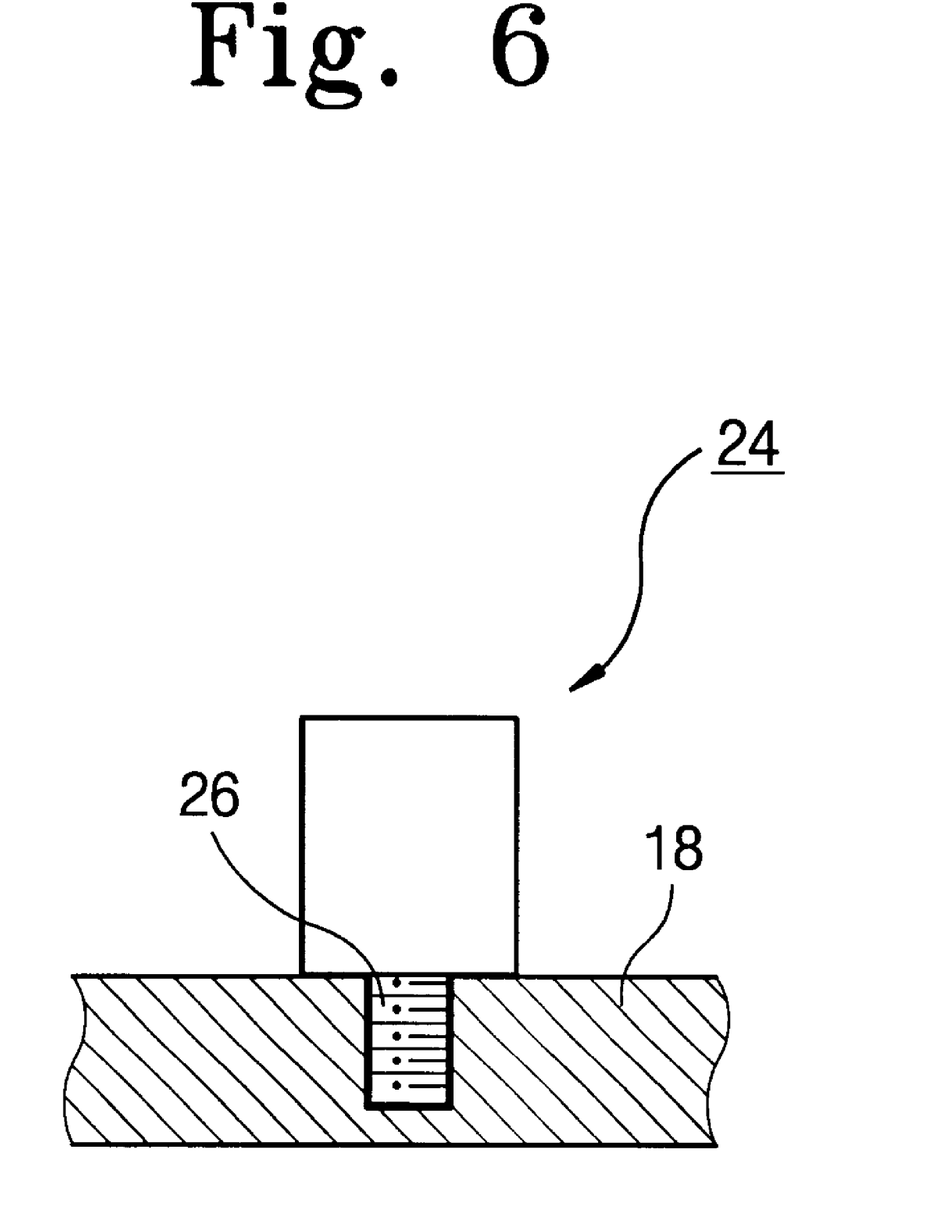
FIG. 6 is an enlarged sectional view showing how a protrusion of FIG. 1 is coupled to a guide plate.

As shown in FIG. 6, each protrusion 24 may be formed by a male member, such as a partially threaded shaft, which is removably inserted into one of a plurality of female receptors, such as threaded holes 26, formed in the upper surface of the guide plates 18. The plurality of female receptors are located at different positions to accommodate various diameters of wafers to be aligned. For example, female receptor positions can correspond to 4 inch, 6 inch, 8 inch, and 12 inch to wafer diameters. As shown in FIG. 4, a plurality of female receptors having various positions corresponding to various wafer sizes are formed on the guide plates 18. The plurality of female receptors may include, for example, 4-inch female receptors 34, 6 inch female receptors 32, 8 inch female receptors 30, and 12-inch female receptors 28.

An operator can assemble or disassemble the protrusion 24 on the guide plates 18 manually, with or without tools. Thus, protrusions can be adjusted to positions appropriate for various wafer diameters.

Other configurations of the protrusions 24 than the threaded versions shown in FIG. 6 are possible. As examples, the protrusion may comprise a member which is forcibly inserted and held by friction, or it may be an arc-shaped protrusion member having an insertion groove formed around the peripheral edge of the wafer.

Figure 5:
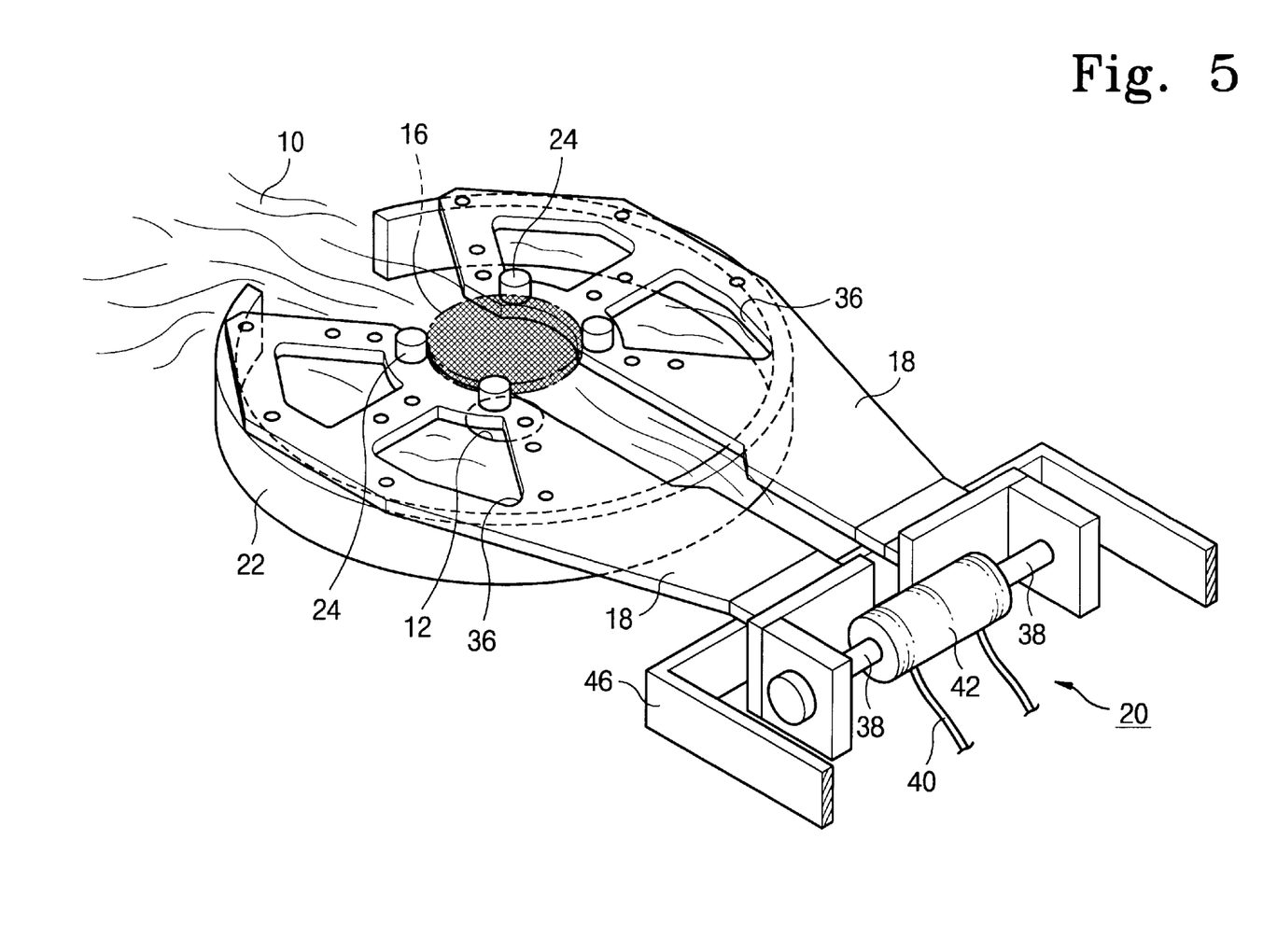
FIG. 5 is a perspective view showing the wafer aligning system according to one embodiment of the present invention, wherein a wafer having a small diameter is contacted and aligned by the guide plates of the wafer aligning system after the guide plates of FIG. 2 have been adjusted.

As shown in FIG. 2, when a 12-inch wafer needs aligning, for example, the protrusions 24 are coupled with 12 inch-female receptors (28 in FIG. 4) previously formed on the guide plates 18. In the case of a 4-inch wafer, as shown in FIG. 5, the protrusions 24 are coupled using the 4-inch female receptors (34 in FIG. 4) previously formed on the guide plates 18.

In addition, as shown in FIG. 4, through holes 36 may be formed on the guide plates 18. When the guide plates 18 are placed under the water surface, the ultrapure water 10 penetrates the through holes 36 and the water surface pushes the wafer 16 upwardly so that the wafer floats. The shapes of the through hole 36 are advantageously wide and symmetrical to allow for sufficient spray pressure to be applied uniformly under the wafer 16.

As shown in FIGS. 1 and 2, the drive part 20 may comprise a horizontal double-acting cylinder 42, with two pistons 38 which are each connected to one end of the left/right guide plates 18. The pistons 38 are horizontally moved by the double-acting cylinder 42 receiving air pressure supplied through an air pressure line 40.

As an alternative to the double-acting cylinder 42, two single-acting cylinders can be connected to the right and left guide plates 18, respectively. It is also possible to employ two double screws with each screw direction being different than the other. The double screws penetrate through a moving member connected to the guide plates, and are rotated by a motor so as to create a linear, reciprocating motion of the moving member. However, it is more desirable to use the double-acting cylinder because it is easier to handle, and it allows for more precise control.

Figure 7:
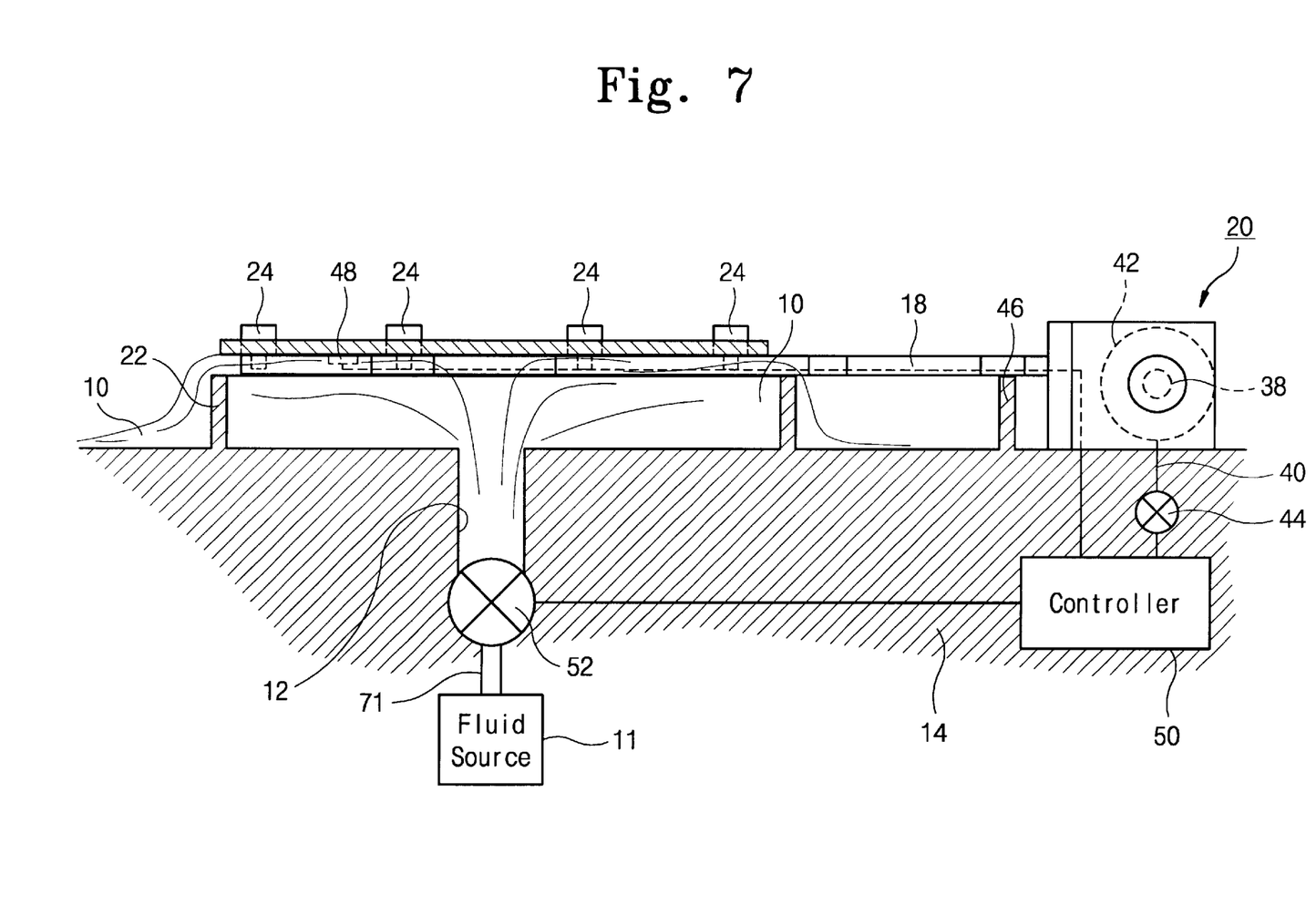
FIG. 7 is a schematic representation showing the wafer aligning system according to one embodiment of the present invention.

In addition, as shown in FIG. 7, the cylinder 42 may have a speed control valve 44 to control the speed of the straight reciprocal piston movement driven by the cylinder 42. The speed control valve 44 controls the flow amount of the air pressure supplied through the air pressure line 40 connected to the cylinder 42. By using the speed control valve 44, the speed is optimized so as to be high enough to align the wafer 16 but low enough to avoid a damaging impact on the wafer 16 by the guide plates 18.

As shown in FIGS. 1 and 2, a shield member 46 is further installed between the drive part 20 and the extended member 22 in order to prevent the ultrapure water 10 from flowing over the extended member 22 and going into the drive part 20.

As shown in FIG. 7, the semiconductor wafer aligning system of the present invention may include a sensor 48 installed on the guide plates 18 for sensing the mounting state of the wafer 16. A controller 50 receives the wafer sensing signal from the sensor 48 and provides a control signal to the cylinder 42 in order to drive the cylinder 42. The controller 50 controls the driving of the cylinder 42 through the air pressure line 40. Also, the controller 50 sends a water control signal to a valve 52 on an ultrapure water line 71 connecting an ultrapure water source 11. This water control signal makes the valve 52 open so as to spray the ultrapure water 10, compressed at a certain pressure. This spray causes the wafer 16 to float on the water surface formed by the water pressure of the ultrapure water.

The aligning operation of one embodiment of the semiconductor wafer aligning system of the present invention is described in detail referring to FIGS. 5 and 7. The protrusions 24 secured on the guide plates 18 are matched to the size of the wafer to be aligned. If necessary, the protrusions are disassembled from the guide plates, and the protrusions 24 are reassembled on the female receptors matching the diameter of the wafer being selected, e.g., one diameter chosen among the 4-inch, 6-inch, 8-inch, and 12-inch female receptors 34, 32, 30 and 28, respectively, which were previously formed on the guide plates 18.

When the protrusions 24 are assembled in accordance with the diameter of the wafer to be aligned, a vacuum chuck for wafer transfer mounts the wafer on the guide plates 18.

At this stage, the sensor 48 installed on the guide plates 18 senses the mounted wafer 16, and transmits a wafer sensing signal to the controller 50. The controller 50 then transmits a water control signal that opens the closed valve 52 connecting the ultrapure water source 11 so that ultrapure water 10 is sprayed on the lower surface of the wafer 16.

When the wafer 16 floats on the water surface formed by the spray pressure of the ultrapure water 10, as shown in FIG. 1, the floating wafer 16 first drifts along the water surface toward the direction of the open wall A in the extended member 22. The wafer is then aligned when both the distance between the guide plates 18 is narrowed, e.g., moved to a narrow limit, as shown in FIG. 2, in response to the guide control signal transmitted from the controller 50.

At this stage, the controller 50 closes the valve 52 to stop spraying the ultrapure water 10 from the source 11.

Then, the aligned wafer 16 is suctioned onto the same vacuum chuck for intraprocessing wafer transfer, e.g., movement within the same equipment, or onto another vacuum chuck for other interprocessing wafer transfer, e.g., for moving to other processing equipment. The separation between the guide plates 18 is widened, e.g., moved to a wide limit, so that the wafer can be freely moved, before the vacuum chuck moves the suctioned wafer.

After that, other wafers to be aligned continue to be mounted on the guide plates and the aligning operation is performed for the new wafer.

Figure 8:
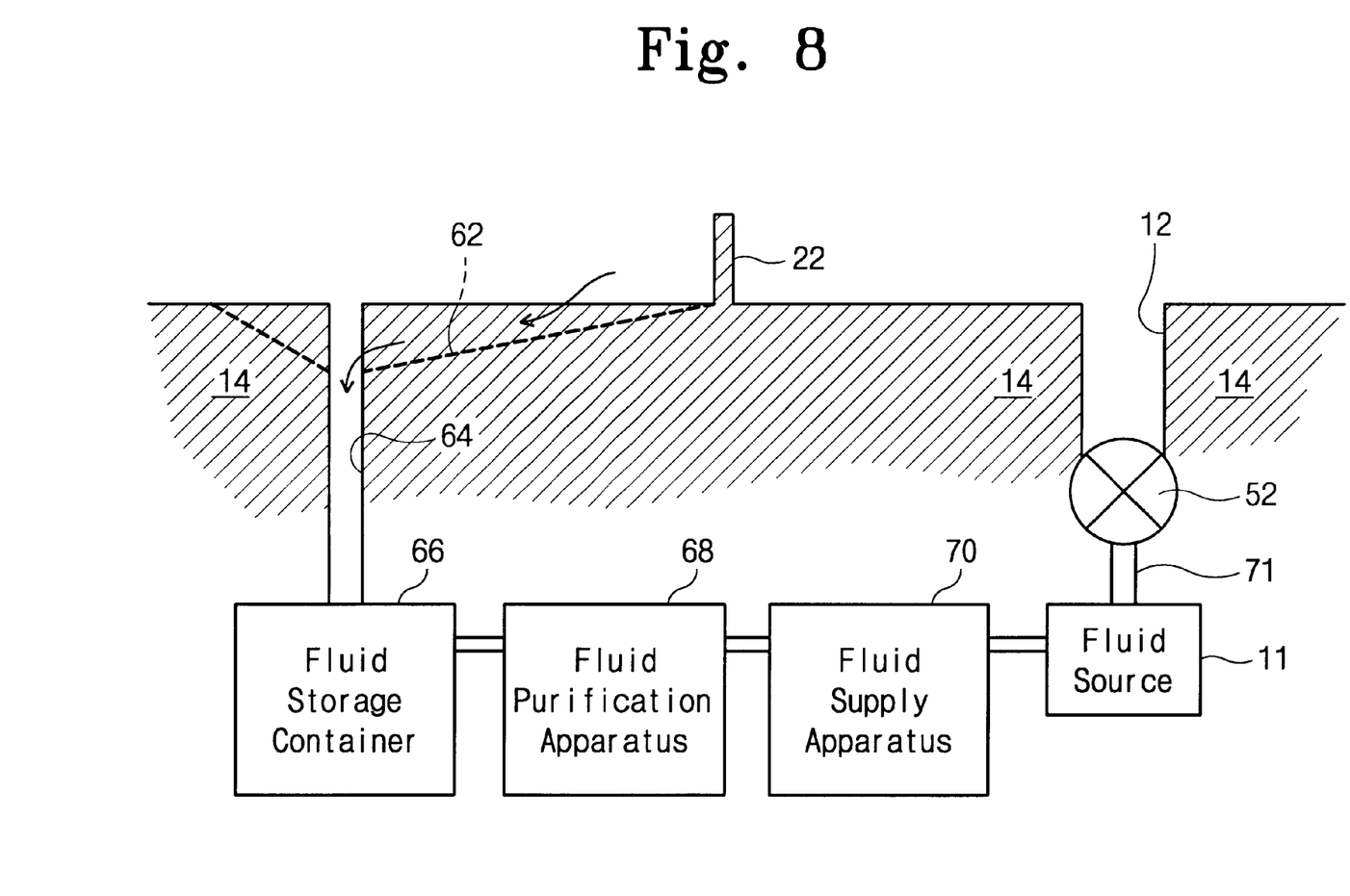
FIG. 8 is a schematic diagram showing the recirculation part of the wafer aligning system according to another embodiment of the present invention.

Referring to FIG. 8, a discharge groove 62 can be further formed in the table 14 in order to collect the sprayed ultrapure water and cause it to flow into a desired discharge direction. The discharge direction is indicated by the arrows in FIG. 8. The ultrapure water flowing along the discharge groove 62 goes into a discharge opening 64 and is stored in an ultrapure water storage container 66 which is installed below the surface of the table 14.

An ultrapure water circulation assembly may also be installed in the table 14 such that the sprayed ultrapure water is discharged out of the table 14 and circulated to the ultrapure water source 11 for reusage. This saves valuable ultrapure water. The ultrapure water circulation assembly may include the discharge groove 62, a ultrapure water purification apparatus 68, for purifying the collected ultrapure water, and a ultrapure water supply apparatus 70 for supplying the purified ultrapure water to the ultrapure water source 11.

The present invention provides a method for aligning wafers using the semiconductor wafer aligning system as described with reference to FIGS. 5 and 7. During guide adjustment, protrusions 24 assembled on the guide plates 18 are disassembled and reassembled on the female receptors according to the diameter of the wafer 16, e.g., by matching the diameter of the wafer 16 among the female receptors 34, 32, 30, 28 previously formed on the guide plates 18. During wafer mounting, a vacuum chuck for wafer transfer mounts the wafer 16 on the guide plates 18. During ultrapure water spraying, when the wafer mounting is completed, the sensor 48 senses that a wafer has been mounted, and provides the wafer sensing signal to the controller 50. Then the controller 50 opens the closed valve 52 to spray the ultrapure water onto the bottom of the wafer 16. During wafer aligning, while the wafer 16 floats over the water surface formed by the spray pressure of the ultrapure water, the floated wafer first drifts along the water surface in a drift direction set by the open wall A of a part of the extended member 22. Then, in a second aligning operation, the wafer 16 is pushed along the sides of the wafer circumference by the protrusions of both guide plates 18 while the separation distance of the plates narrows, according to the guide control signal from the controller 50. At the narrow limit, the guide plates 18 securely hold the wafer 16 in alignment, and the controller 50 closes the valve 52 so as to stop the spray of the ultrapure water. During wafer transfer, the vacuum chuck for wafer transfer suctions the aligned wafer, and when the guide plates 18 are widened so as to free the wafer 16, the vacuum chuck moves the wafer 16 within the equipment or to another piece of equipment.

Using this method, the wafer aligning operation starts only after the wafer is completely mounted. Also, the usage of ultrapure water is minimized because the spray of the ultrapure water starts only after the wafer mounting is confirmed, and the spray stops as soon as the wafer 16 is aligned.

In the case of wafer back side grinding, some steps precede mounting the wafer on the semiconductor wafer aligning system of the present invention. First, during laminating, an adhesive tape is applied on the front side of the wafer, which has a pattern formed thereon. The tape protects the front side while the back side grinding occurs. A vacuum chuck for wafer transfer attaches to the wafer and transfers the wafer with its back side upwardly directed, and its front side downwardly directed. Then, after the wafer transfer, wafer back side grinding is performed, wherein the wafer is placed in the correct location, and then, the back side of the wafer is cut or ground using a cutter or a grinder.

According to the semiconductor wafer aligning system and method of the present invention as described above, wafer damage is minimized, the generation of particles is prevented, precise aligning of the wafer can be provided, and usage of ultrapure water is minimized.

While example embodiments of the present invention have been described in detail above, it should be understood that various changes, substitutions and alterations can be made hereto by one of ordinary skill in the art without departing from the spirit and scope of the invention as defined by the appended claims and their equivalents.

What is claimed is:

1. A semiconductor wafer aligning system comprising;
    a table having a spray opening for upwardly spraying a fluid to form a fluid surface on which a semiconductor wafer floats; and
    a guide disposed on the table, for contacting the wafer at a circumferential edge of the wafer, wherein the fluid flows horizontally after being sprayed upward, and the wafer floats horizontally on a surface of the fluid to a correct wafer location;
    wherein the guide comprises;
    a left guide for contacting the wafer along one portion of the circumferential edge of the wafer;
    a right guide for contacting the wafer along another portion of the circumferential edge of the wafer; and
    a drive mechanism connected to the left and right guides, disposed outside a peripheral edge of the spray opening, for varying a separation distance between the left guide and the right guide.

2. The aligning system of claim 1, wherein each of the left guide and the right guide comprises:
    a horizontal plate for supporting the bottom of the wafer when the wafer is not floating; and
    an upward protrusion connected to the horizontal plate for contacting the circumferential edge of the wafer.

3. The aligning system of claim 2, wherein the horizontal plate comprises plural sets of female receptors, each of the plural sets of female receptors corresponding to a respective one of a plurality of wafer diameters, and
    wherein each of the protrusions comprises male member which is removably inserted into one of the plurality of female receptors.

4. The aligning system of claim 2, wherein the horizontal plate comprises a fluid through hole for passing fluid upward therethrough.

5. The aligning system of claim 1, the drive mechanism comprising:
    an air pressure line;
    first and second piston assemblies connected to the right guide and the left guide, respectively; and
    a cylinder, in flow communication with the air pressure line, which induces a reciprocating movement of the first and second piston assemblies in response to air pressure in the air pressure line.

6. The aligning system of claim 5, the air pressure line comprising a speed control part for controlling a speed of the reciprocating movement by controlling an amount of the air pressure in the air pressure line.

7. The aligning system of claim 1, further comprising:
    an upward extended wall disposed on the table and at least partially surrounding the spray opening and interposed between the spray opening and the drive mechanism, the upward extended wall defining an area of the fluid surface on which the semiconductor wafer floats; and
    a shield member disposed between the drive mechanism and the upward extended wall for preventing the fluid from flowing onto the drive mechanism.

8. A semiconductor wafer aligning system comprising:
    a table having a spray opening for upwardly spraying a fluid to form a fluid surface on which a semiconductor wafer floats;
    a guide disposed on the table, for contacting the wafer at a circumferential edge of the wafer, wherein the fluid flows horizontally after being sprayed upward, and the wafer floats horizontally on a surface of the fluid to a correct wafer location;
    a sensor disposed on the guide for sensing whether the wafer is mounted and for transmitting a sensing signal corresponding to a mounted state of the wafer; and
    a controller in communication with the sensor, for receiving the wafer sensing signal and transmitting a guide control signal to the guide for controlling a guide movement of the guide.

9. The aligning system of claim 8, further comprising:
    a fluid line for supplying the fluid to the spray opening; and
    a valve disposed on the fluid line for opening and closing the fluid line in response to a control signal from the controller.

10. A semiconductor wafer aligning system comprising:
    a table having a spray opening for upwardly a fluid to form a fluid surface on which a semiconductor wafer floats;

a guide disposed on the table, for contacting the wafer at a circumferential edge of the wafer, wherein the fluid flows horizontally after being sprayed upward, and the wafer floats horizontally on a surface of the fluid to a correct wafer location; and a fluid circulation assembly for recirculating sprayed fluid to be reused at the spray opening;

wherein the fluid circulation assembly comprises;

a discharge groove formed on a top surface of the table outside the spray opening, oriented to carry the sprayed fluid in a discharge direction;

a fluid purification apparatus in flow communication with the discharge groove, for receiving and purifying discharged fluid;

a fluid supply apparatus in flow communication with the fluid purification apparatus for supplying purified; and a fluid source in flow communication with the fluid supply apparatus and the spray opening, for providing fluid to the spray opening.

11. A method of aligning a semiconductor wafer using a semiconductor wafer aligning system having a table with a spray opening and a guide mechanism, the method comprising:

spraying a liquid through the spray opening upward toward a wafer to cause the wafer to float on a liquid surface formed by the sprayed liquid; and using the guide mechanism to guide the wafer as the liquid flows horizontally after being sprayed upward, such that the wafer floats horizontally on a surface of the liquid to a correct wafer location;

wherein the guide mechanism includes a plurality of receptors for removably receiving protrusion members, and wherein said method further comprises inserting the protrusion members in selected ones of the receptors according to a diameter of the wafer.

* * * * *